United States Patent
Ravgad

(10) Patent No.: US 11,763,860 B2
(45) Date of Patent: Sep. 19, 2023

(54) MULTI-PORT SDRAM

(71) Applicant: Microsoft Technology Licensing, LLC, Redmond, WA (US)

(72) Inventor: Segev Ravgad, Ramat HaSharon (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/644,770

(22) Filed: Dec. 16, 2021

(65) Prior Publication Data

US 2023/0197124 A1  Jun. 22, 2023

(51) Int. Cl.
G11C 7/10 (2006.01)

(52) U.S. Cl.
CPC ............ *G11C 7/1075* (2013.01); *G11C 7/109* (2013.01); *G11C 7/1045* (2013.01); *G11C 7/1063* (2013.01)

(58) Field of Classification Search
CPC ... G11C 7/1075; G11C 7/1045; G11C 7/1063; G11C 7/109
USPC ........................................ 365/230.05, 189.05
See application file for complete search history.

(56) References Cited

U.S. PATENT DOCUMENTS

| | | | |
|---|---|---|---|
| 5,875,470 A | 2/1999 | Dreibelbis et al. | |
| 5,895,487 A | 4/1999 | Boyd et al. | |
| 6,571,302 B1 | 5/2003 | Dewilde et al. | |
| 7,428,618 B2 | 9/2008 | Najam et al. | |
| 7,697,362 B2 | 4/2010 | Lee et al. | |
| 7,869,301 B2 | 1/2011 | Cowles et al. | |
| 8,611,173 B1 * | 12/2013 | Zhang | G11C 7/1075 365/230.02 |
| 8,711,645 B2 * | 4/2014 | Chakravarty | G11C 7/1075 365/201 |
| 8,953,368 B2 * | 2/2015 | Cha | G11C 7/04 365/158 |
| 9,007,817 B2 * | 4/2015 | Chai | G11C 7/12 365/230.05 |
| 9,026,746 B2 * | 5/2015 | Tanaka | G11C 29/818 711/149 |
| 10,153,020 B1 * | 12/2018 | Vimercati | G11C 11/005 |
| 2003/0056072 A1 * | 3/2003 | Schmisseur | G06F 12/0802 711/158 |
| 2004/0037153 A1 | 2/2004 | Cohen et al. | |

(Continued)

OTHER PUBLICATIONS

Zhang, et al., "Design of Dual-Processor Sharing DRAM Controller", In Proceedings of the Second International Workshop on Computer Science and Engineering, Oct. 28, 2009, pp. 298-302.

(Continued)

*Primary Examiner* — Michael T Tran
(74) *Attorney, Agent, or Firm* — Alleman Hall Creasman & Tuttle LLP

(57) ABSTRACT

Examples are disclosed that relate to a multi-port synchronous dynamic random access memory (SDRAM). One example provides a multi-port SDRAM comprising a first port, a second port, a first memory portion, and a second memory portion. At least the first memory portion is configured as shared such that the first memory portion is accessible at the first port and not the second port in a first mode, and the first memory portion is accessible at the second port and not the first port in a second mode. The multi-port SDRAM further comprises a mode controller controllable to selectively change the multi-port SDRAM between at least the first mode and the second mode.

18 Claims, 6 Drawing Sheets

(56) References Cited

U.S. PATENT DOCUMENTS

| | | | |
|---|---|---|---|
| 2007/0150668 A1 | 6/2007 | Kwon et al. | |
| 2008/0117285 A1* | 5/2008 | Tanaka | H04N 7/152 |
| | | | 348/14.09 |
| 2010/0232238 A1* | 9/2010 | Jung | G11C 7/1075 |
| | | | 365/189.05 |
| 2017/0060476 A1* | 3/2017 | Chinnakkonda | |
| | | Vidyapoornachary | G11C 7/04 |
| 2018/0225235 A1* | 8/2018 | Lee | G06F 11/1048 |
| 2019/0172518 A1* | 6/2019 | Chen | G11C 11/4085 |
| 2019/0361516 A1* | 11/2019 | Bhattacharyya | G06F 12/0607 |
| 2021/0165569 A1* | 6/2021 | Ramesh | G11C 13/0004 |
| 2022/0108755 A1* | 4/2022 | Hartz | G11C 16/30 |
| 2022/0398024 A1* | 12/2022 | Ge | G11C 16/30 |

OTHER PUBLICATIONS

"International Search Report and Written Opinion Issued in PCT Application No. PCT/US22/043164", dated Dec. 9, 2022, 9 Pages.

* cited by examiner

MULTI-PORT SDRAM

BACKGROUND

A computing system may comprise multiple compute devices. For example, some computing systems include a central processing unit (CPU) and an accelerator, such as a graphics processing unit (GPU) or a neural processing unit (NPU). In such computing systems, each compute device may communicate with device memory.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to a multi-port synchronous dynamic random access memory (SDRAM). One example provides a multi-port SDRAM comprising a first port, a second port, a first memory portion, and a second memory portion. At least the first memory portion is configured as shared such that the first memory portion is accessible at the first port and not the second port in a first mode, and the first memory portion is accessible at the second port and not the first port in a second mode. The multi-port SDRAM further comprises a mode controller controllable to selectively change the multi-port SDRAM between at least the first mode and the second mode.

DETAILED DESCRIPTION

Some computing systems may use device memory comprising a SDRAM. A SDRAM receives memory instructions with an associated memory address from a client compute device, and sends/receives associated data to/from the client compute device based upon the memory address and memory instructions. A computing system that comprises multiple compute devices also may include multiple SDRAMs, such as one SDRAM for each compute device.

However, using separate SDRAMs for each compute device may pose various problems. For example, each additional SDRAM included in a computing system may add cost to the computing system. Further, the copying of data from one SDRAM to another SDRAM (e.g. using a peripheral component interconnect express (PCIe) interface or other suitable interface) to allow different compute devices to access the data consumes power and may introduce latency. A PCIe interface also may increase a pinout of the compute device, and/or add hardware and software complexity to the compute devices.

Accordingly, examples are disclosed that relate to a multi-port SDRAM useable by two or more compute devices. Briefly, a multi-port SDRAM according to the present examples comprises a first port, a second port, a first memory portion, a second memory portion, and a mode controller. The first memory portion is configured as shared such that the first memory portion is accessible at a first port in a first mode, and accessible at a second port in a second mode. The mode controller is controllable to selectively change the multi-port SDRAM between at least the first mode and the second mode. In some examples, such a multi-port SDRAM may be used in a computing system comprising a first client and a second client. Each of the first client and the second client may comprise separate compute devices on the computing system. The first client is connected to the first port of the multi-port SDRAM and the second client is connected to the second port of the multi-port SDRAM. Thus, both the first client and the second client can communicate with the first memory portion of the multi-port SDRAM, thereby allowing for the use of fewer SDRAMs compared to the use of one SDRAM per compute device. The use of fewer SDRAMs than compute devices may reduce a number of PCIe interfaces, and thus may reduce power consumption compared to the use of an SDRAM for each compute device. Further, the use of fewer SDRAMs also may reduce an overall device cost.

Figure 1A:
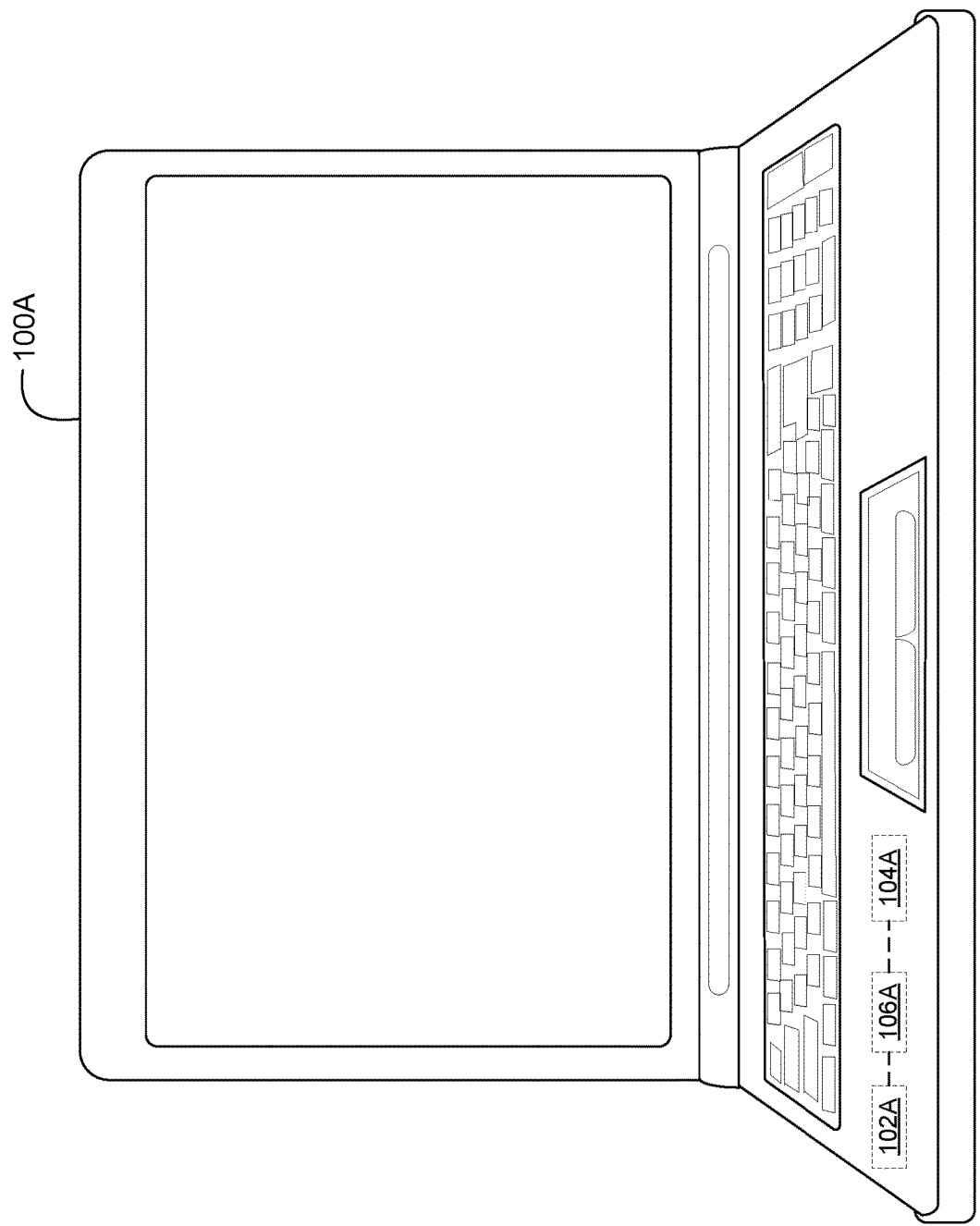
FIGS. 1A and 1B show examples of computing systems each comprising a multi-port SDRAM.

FIG. 1A shows an example computing system 100A that can utilize a multi-port SDRAM. Computing system 100A takes a form of a laptop, and comprises a first client 102A and a second client 104A connected to a multi-port SDRAM 106A, as will be discussed in more detail below. The first client 102A and second client 104A can comprise any suitable compute devices, such as a CPU and an accelerator.

Figure 1B:
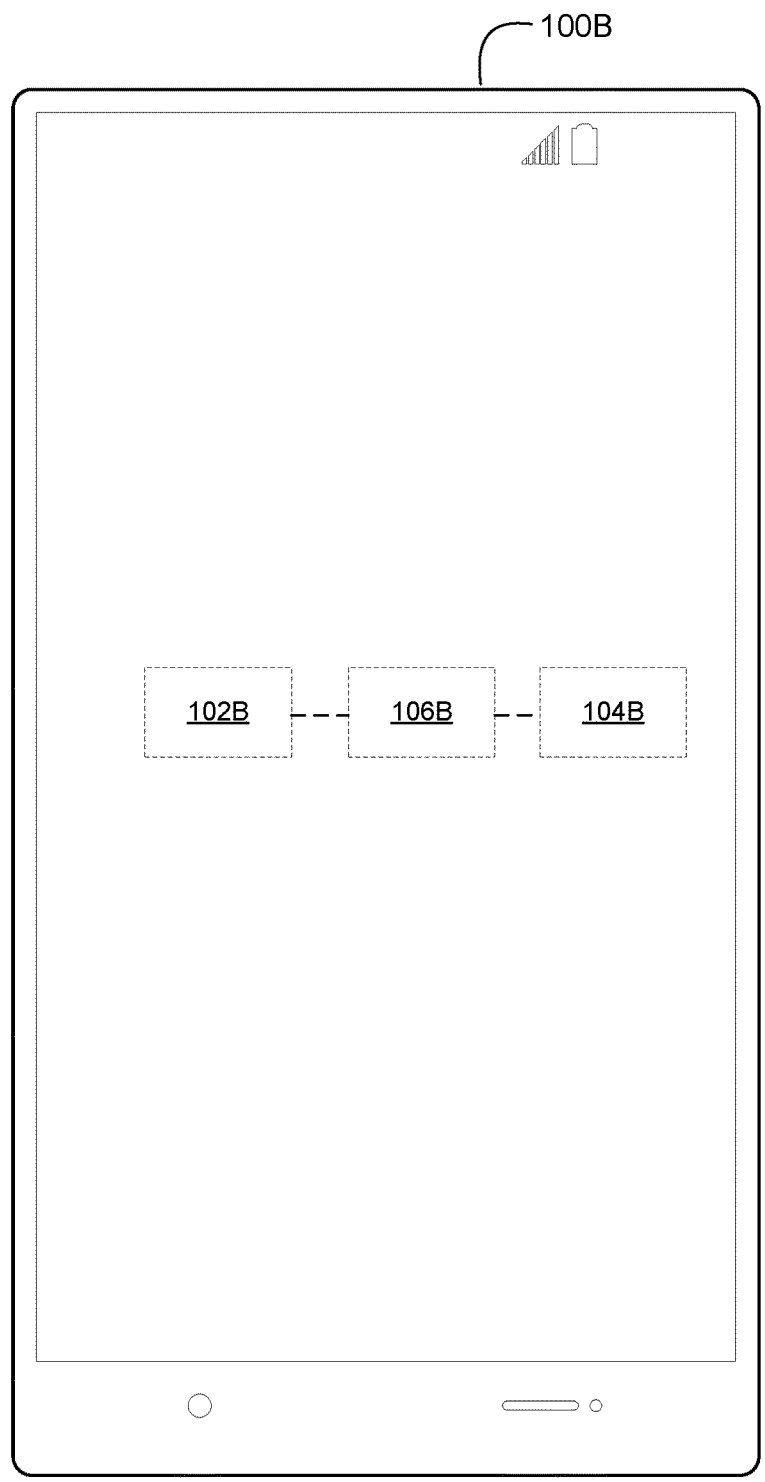

FIG. 1B shows another example computing system 100B that can utilize a multi-port SDRAM. Computing system 100B takes a form of a smartphone, and comprises a first client 102B and a second client 104B connected to a multi-port SDRAM 106B. The first client 102B and the second client 104B can comprise any suitable compute devices, such as a CPU and an accelerator. Further examples of computing systems that can utilize a multi-port SDRAM include, but are not limited to, tablet computers, head-mounted computing systems (e.g. augmented reality and virtual reality head-mounted display devices), desktop computers, server computers, and wrist worn computing systems.

Figure 2:
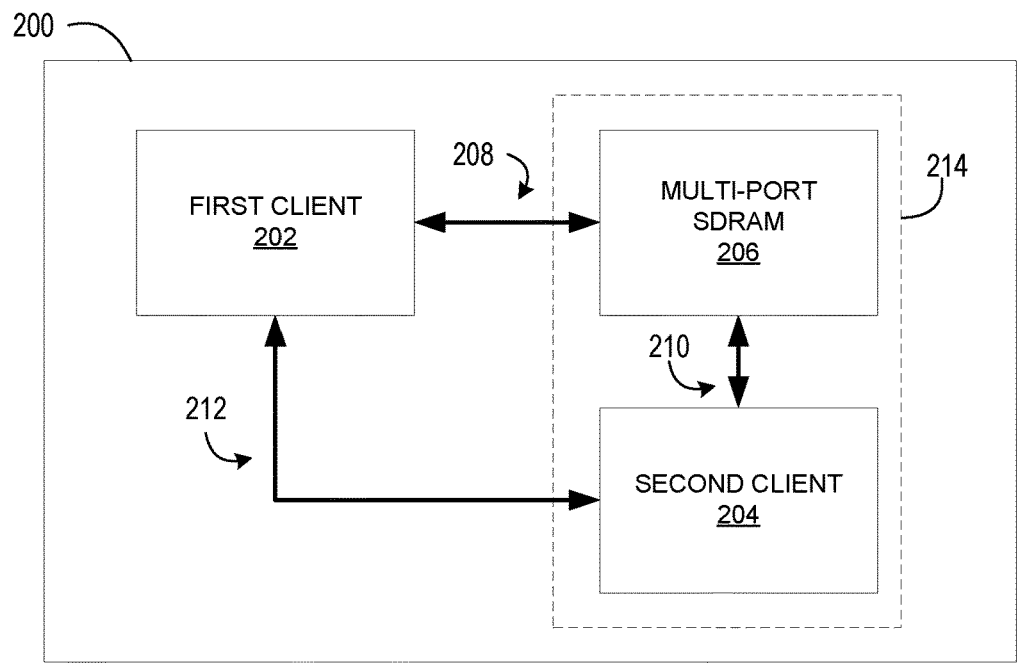
FIG. 2 shows an example computing system comprising two clients and a dual-port SDRAM.

FIG. 2 shows an example computing system 200 comprising a first client 202, a second client 204, and a multi-port SDRAM 206. Computing systems 100A and 100B are examples of computing system 200. First client 202 is connected to a first port of multi-port SDRAM 206, as depicted by connection 208. In the depicted example, first client 202 communicates memory instructions and associated data at the first port of multi-port SDRAM 206. Similarly, second client 204 is connected to a second port of multi-port SDRAM 206, depicted by connection 210. Multi-port SDRAM 206 can comprise a single data rate (SDR) SDRAM, a double date rate (DDR) SDRAM (e.g. DDR4 or DDR5), a low power double data rate (LPDDR) SDRAM, or any other suitable SDRAM.

In the depicted example, first client 202 and second client 204 are connected via connection 212. In some examples, connection 212 comprises a quad serial peripheral interface (QSPI). The use of a QSPI may be more power-efficient than PCIe, and also may allow for a simpler pinout configuration compared to PCIe. In other examples, connection 212 may comprise any other suitable interface, or may be omitted. In some examples, first client 202 comprises a CPU and second client 204 comprises an accelerator device, such as a GPU or a NPU for example. In other examples, first client 202 and second client 204 may comprise any other suitable compute device(s). In yet other examples, second client 204 may comprise a camera or other suitable hardware device.

Computing system 200 may have a lower cost and/or lower power consumption than a device comprising a first SDRAM connected a first client device and a second SDRAM connected a second client device. Further in some examples, second client 204 and multi-port SDRAM 206 optionally may be co-packaged in a multi-chip module, indicated at 214. Such a configuration may further reduce power and/or cost of computing system 200. Further, the multi-chip module may help to simplify an interface between multi-port SDRAM 206 and second client 204, such as using an interposer for example. In other examples, other suitable device packaging may be used for computing system 200.

Figure 3:
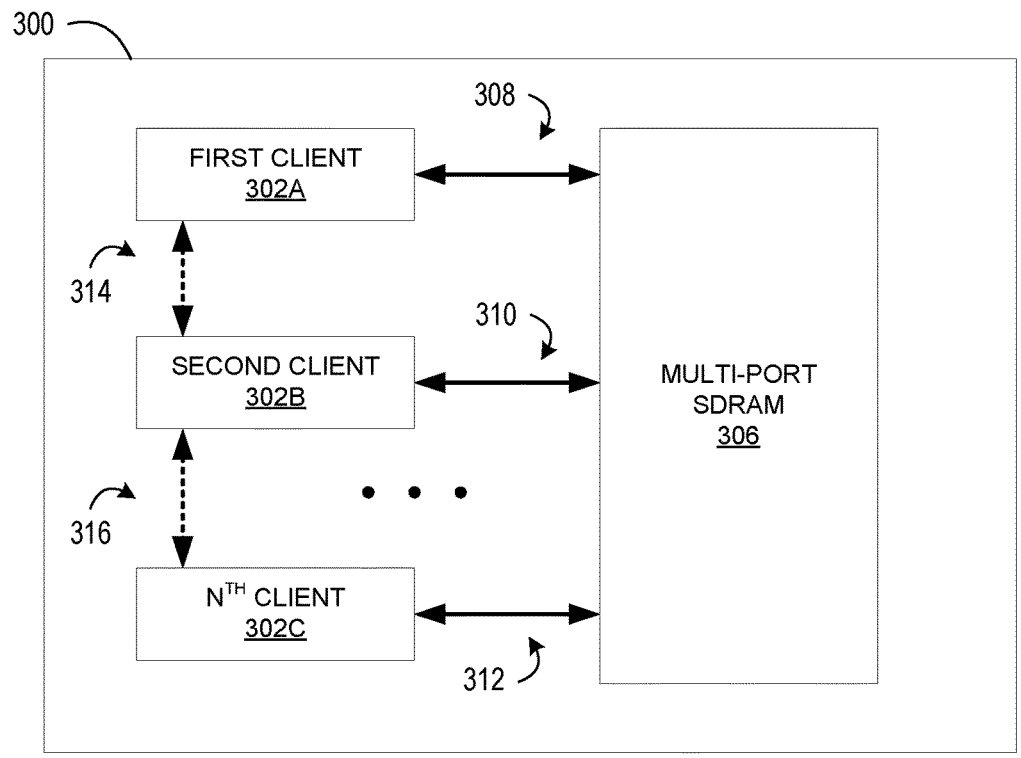
FIG. 3 shows another example computing system comprising plural clients and a multi-port SDRAM.

FIG. 3 shows another example computing system 300 comprising a plurality of clients 302 and a multi-port SDRAM 306. Computing system 200 is an example of computing system 300. Each of the plurality of clients 302 is connected to a different port of multi-port SDRAM 306. In the depicted example, first client 302A is connected to a first port of multi-port SDRAM 306, as depicted by connection 308, second client 302B is connected to a second port of multi-port SDRAM 306, as depicted by connection 310, and $N^{th}$ client 302C is connected to an $N^{th}$ port of multi-port SDRAM 306, as depicted by connection 312. In the depicted example, "N" indicates any arbitrary number of clients/ports. First client 302A communicates memory instructions and associated data at the first port of multi-port SDRAM 306. Similarly, second client 302B communicates at the second port of multi-port SDRAM 306, and $N^{th}$ client 302C communicates at the $N^{th}$ port of multi-port SDRAM 306. Multi-port SDRAM 306 can be a SDR SDRAM, a DDR SDRAM, or any other suitable SDRAM. In this example, the number N of clients and SDRAM ports is the same. In other examples a device may not utilize all available SDRAM ports, in which case the number of clients would be lower than the number of SDRAM ports. In some examples, the first port of multi-port SDRAM 306 can access a first memory portion when in a first mode of multi-port SDRAM 306, as will be discussed in more detail below, and in parallel the second port of multi-port SDRAM 306 can access a second memory portion when in the first mode.

Computing system 300 optionally may comprise connection 314 and/or connection 316 between two or more clients of plurality of clients 302. In the depicted example, connection 314 connects first client 302A and second client 302B, and connection 316 connects second client 302B and $N^{th}$ client 302C. In other examples, any suitable configuration can connect plurality of clients 302. In some examples, connections 314 and 316 may comprise any suitable compute interface, such as a QSPI. In some examples, one or more of plurality of clients 302 can comprise a CPU, an accelerator device such as a GPU or an NPU, or any suitable compute device. In such examples, multi-port SDRAM 306 can comprise a memory portion configured as shared, as explained in more detail below, thus enabling the CPU to write data to the shared memory portion and the accelerator to read the data from the shared memory portion. In such a configuration, data may be shared between the CPU and the accelerator clients via multi-port SDRAM 306.

Figure 4:
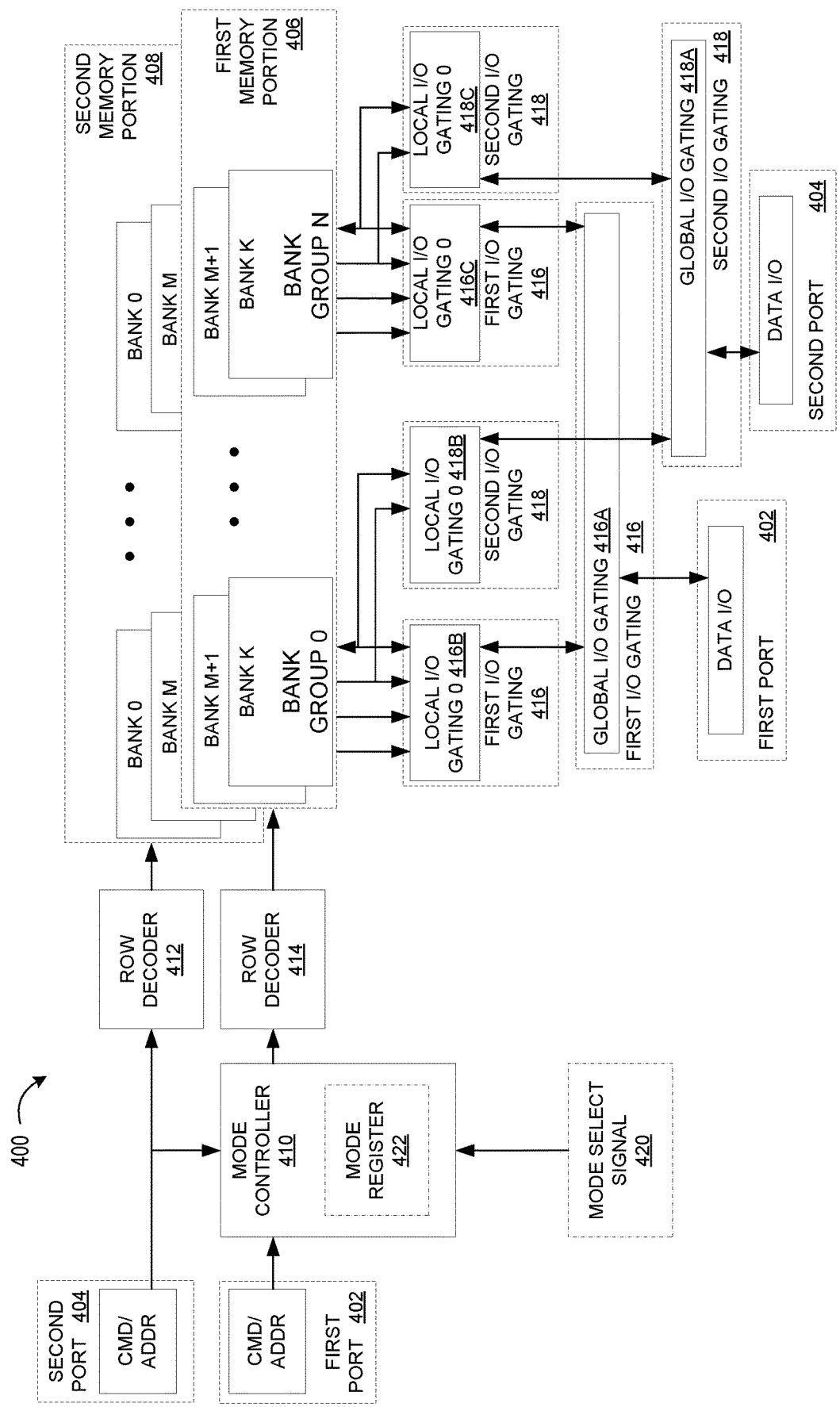
FIG. 4 shows a block diagram of an example multi-port SDRAM.

FIG. 4 shows a block diagram of an example multi-port SDRAM 400. Multi-port SDRAMs 106A, 106B, 206 and 306 are examples of multi-port SDRAM 400. Multi-port SDRAM 400 comprises a first port 402, a second port 404, a first memory portion 406, a second memory portion 408, a mode controller 410, a first row decoder 412, a second row decoder 414, a first input/output (I/O) gating stage 416, and a second input/output gating stage 418. In the depicted example, first memory portion 406 is configured as shared such that first memory portion 406 is accessible at first port 402 and second port 404, and second memory portion 408 is configured as private such that second memory portion 408 is accessible at second port 404 and not first port 402. In other examples, multi-port SDRAM 400 may comprise any suitable number of memory portions each individually configured as shared such that the memory portion is accessible at more than one port, or configured as private such that the memory portion is accessible at one port. A memory portion configured as shared such as first memory portion 406 may enable a first client connected at first port 402 and a second client connected at second port 404 to communicate data through multi-port SDRAM 400, and/or to access shared data stored in first memory portion 406. A memory portion configured as private such as second memory portion 408 may enable private data stored in memory portion 408 to not be accessible by a client not connected at second port 404.

In the depicted example, first memory portion 406 comprises memory bank M+1 to bank K of group 0 to group N, and second memory portion 408 comprises memory bank 0 to bank M of group 0 to group N. Herein, M, K, and N are used to illustrate any suitable number of banks and/or groups. In other examples, first memory portion 406 and second memory portion 408 may comprise any other suitable set of memory addresses, contiguous or non-contiguous. In other examples, multi-port SDRAM 400 can comprise any suitable number of memory portions configured as described herein, and any suitable number of ports.

Mode controller 410 is controllable to selectively change multi-port SDRAM 400 between at least a first mode and a second mode. For example, first memory portion 406 is accessible at first port 402 and not second port 404 in the first mode, and first memory portion 406 is accessible at second port 404 and not first port 402 in the second mode. In such an example, controlling the first mode and the second mode can control access to first memory portion 406 such that an access at first port 402 may not conflict with an access at second port 404. Further, second memory portion 408 is accessible at second port 404 in the first mode. In some examples, first port 402 can be disabled in the second mode. Such a configuration may reduce a conflict with an access at first port 402 in the second mode where first memory portion 406 and second memory portion 408 are accessible at second port 404. Mode controller 410 may be controlled in a time division scheme, an arbitration scheme, or using any other suitable control scheme.

In some examples, mode controller 410 comprises an optional pin configured to receive a mode select signal 420. Mode select signal 420 can indicate which mode of multi-port SDRAM 400 to select. Such a configuration may help to simplify logic of mode controller 410. In other examples, mode controller 410 comprises optional mode register 422 configured to store values relating to controlling the selection between modes of the multi-port SDRAM 400. Mode register 422 may be written by data at first port 402, at second port 404, or any other suitable data source. Mode register 422 may help reduce a number of control pins at mode controller 410. In some examples, multi-port SDRAM 400 may comprise any suitable number of modes.

First port 402 and second port 404 are configured to receive memory instructions (CMD (command)) comprising a memory address (ADR) and associated data. Examples of instructions include a memory read or a memory write. First row decoder 412 is configured to help decode a memory address received at first port 402 or a memory address received at second port 404, depending upon a mode of operation. Likewise, second row decoder 414 is configured to help decode a memory address received at second port 404. In some examples, other decoders may be used to help decode memory addresses received at one or more of first port 402 and second port 404.

First input/output gating stage 416 is configured to help control a flow of the associated data between first and second memory portions 406, 408 and first port 402. For example, first port 402 communicates with first input/output gating stage 416 comprising a global input/output stage 416A and a local input/output gating stage for each bank, indicated as local input/output gating 0 416B and local input output gating N 416C respectively for bank groups 0 and N. First port 402 communicates with global input/output gating stage 416A, through which local input/output gating 0 416B and local input/output gating N 416C are accessible. First input/output gating stage 416 communicates with first memory portion 406 and second memory portion 408. In this example, local input/output gating 0 416B can select group 0 to read and/or write associated data, and local input/output gating N 416C can select group N to read and/or write associated data, based at least in part on the memory address.

Second input/output gating stage 418 is configured to help control a flow of the associated data between second memory portion 408 and second port 404. In the depicted example, second port 404 communicates with a global input/output gating 418A of second input/output gating stage 418. Global input/output gating 418A of second input/ output gating stage 418 communicates with bank group 0 via local input/output gating 0 418B, and with bank group N via local input/output gating 1 418N. In other examples, any other suitable communication between first and second input/output gating stages 416, 418 and first and second memory portions 406, 408 can be used.

First input/output gating stage 416 and second input/ output gating stage 418 can comprise any suitable data flow circuitry. Further, in the depicted example, first and second input/output gating stages 416 and 418 comprise two stages of gating (global and local). In other examples, any suitable number of gating stages can be used. In some examples, first input/output gating stage 416 is enabled when there is an active memory instruction at first port 402, and second input/output gating stage 418 is enabled when there is an active memory instruction at second port 404.

Figure 5:
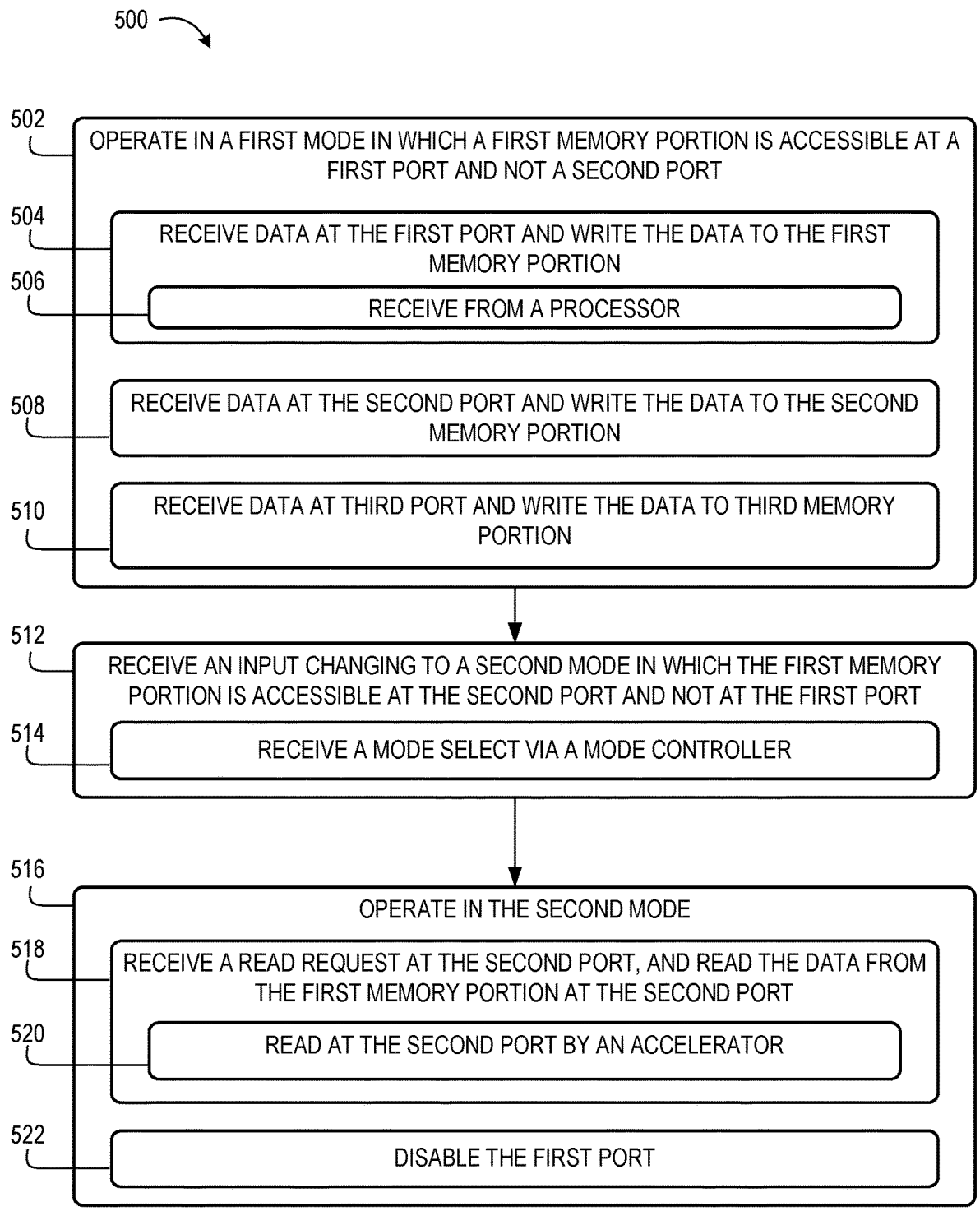
FIG. 5 shows an example method of operating a multi-port SDRAM.

FIG. 5 shows an example method 500 of operating a multi-port SDRAM comprising a first port, a second port, a first memory portion, and a second memory portion. Method 500 may be performed on multi-port SDRAM 400, and on computing systems 100A, 100B, 200 and 300, for example. Method 500 comprises, at 502, operating in a first mode in which a first memory portion is accessible at the first port and not at the second port. The first memory portion may comprise any suitable set of contiguous or non-contiguous memory addresses of the SDRAM. Method 500 further comprises, at 504, receiving data at the first port and writing the data to the first memory portion. In some examples, the data may be received from a processor, as indicated at 506. In other examples, the data may be received from any suitable compute device. Method 500 comprises, at 508, receiving data at the second port and writing the data at the second port to the second memory portion. In some examples, process 508 may be done concurrently as process 504. In other examples, process 508 may be performed in any suitable temporal relation to process 504. The multi-port SDRAM can comprise any suitable number of ports and/or memory portions, as previously described. In examples where the multi-port SDRAM further comprises a third memory portion accessible at a third port, method 500 comprises receiving data at the third port and writing the data at the third port to the third memory portion at 510. Similar to process 508, process 510 can be performed concurrently or at any suitable temporal relation to process 504. Similarly, data can be received at any additional port of the multi-port SDRAM and the data at the additional port can be written to a corresponding additional memory portion of the multi-port SDRAM.

Continuing, method 500 comprises, at 512, receiving an input changing the multi-port SDRAM to a second mode in which the first memory portion is accessible at the second port and not at the first port. In some examples, method 500 comprises, at 514, receiving a mode select value via a mode controller of the multi-port SDRAM. The mode controller is controllable to selectively change the mode of the multi-port SDRAM.

Method 500 comprises, at 516, operating in the second mode. Operating in the second mode comprises, at 518, receiving a read request at the second port, and reading the data from the first memory portion at the second port. In some examples, method 500 comprises reading the data from the first memory portion at the second port by an accelerator device, such as a GPU or an NPU, as indicated at 520. Method 500 further may comprise, at 522, disabling the first port while operating in the second mode. In other examples, a multi-port SDRAM may support any other suitable number of modes, which may depend upon how many memory portions are configured in the multi-port SDRAM.

Thus, by utilizing a multi-port SDRAM according to the disclosed examples, a computing system comprising a first client and a second client that access the SDRAM at a first port and a second port may consume less power and/or cost less than a computing system comprising a first client device connected to a first SDRAM and a second client device connected to a second SDRAM. For example, the use of a memory portion of the multi-port SDRAM configured as shared allows the memory portion to be accessible at the first port and the second port, allowing data in the memory portion to be accessed by different compute devices without copying from the first SDRAM to the second SDRAM. This may help to save power and avoid latencies associated with copying data between SDRAMs. Further, utilizing a multi-port SDRAM according to the disclosed examples may allow the use of a simpler interface, such as QSPI, between the first and second clients than a PCIe interface. The use of a QSPI interface may reduce pin count, power, and/or reduce hardware and software complexity of the compute devices over the use of the PCIe interface.

In some embodiments, the methods and processes described herein may be tied to a computing system of one or more computing devices. In particular, such methods and processes may be implemented as a computer-application program or service, an application-programming interface (API), a library, and/or other computer-program product.

Figure 6:
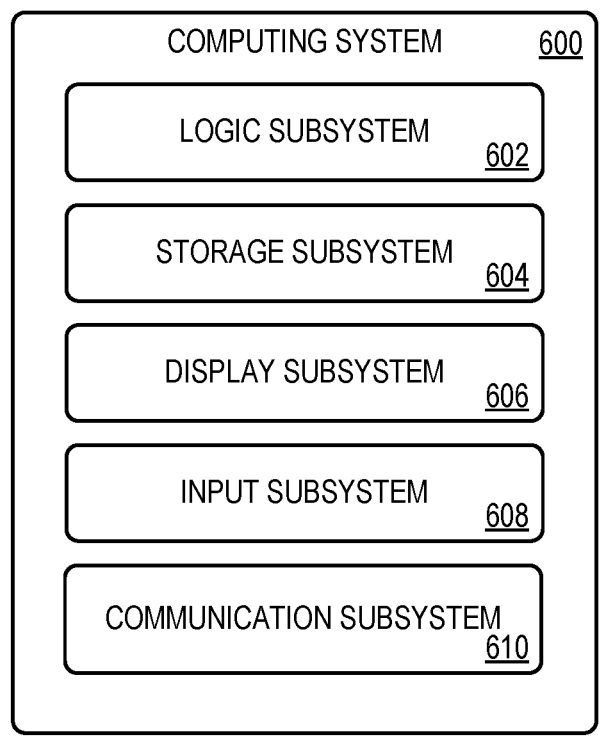
FIG. 6 shows a block diagram of an example computing system.

FIG. 6 schematically shows a non-limiting embodiment of a computing system 600 that can enact one or more of the methods and processes described above. Computing system 600 is shown in simplified form. Computing systems shown in FIG. 1A, FIG. 1B, FIG. 2, and FIG. 3 are examples of computing system 600. Computing system 600 may take the form of one or more personal computers, server computers, tablet computers, home-entertainment computers, network computing devices, gaming devices, mobile computing devices, mobile communication devices (e.g., smart phone), and/or other computing devices.

Computing system 600 includes a logic subsystem 602 and a storage subsystem 604. Computing system 600 may optionally include a display subsystem 606, input subsystem 608, communication subsystem 610, and/or other components not shown in FIG. 6.

Logic subsystem 602 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 604 includes one or more physical devices configured to hold instructions executable by the logic machine to implement the methods and processes described herein. When such methods and processes are implemented, the state of storage subsystem 604 may be transformed—e.g., to hold different data.

Storage subsystem 604 may include removable and/or built-in devices. Storage subsystem 604 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 604 may include volatile, nonvolatile, dynamic, static, read/write, read-only, random-access, sequential-access, location-addressable, file-addressable, and/or content-addressable devices. The multi-port SDRAM depicted in FIGS. 2-4 are examples of storage subsystem 604.

It will be appreciated that storage subsystem 604 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 602 and storage subsystem 604 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 606 may be used to present a visual representation of data held by storage subsystem 604. This visual representation may take the form of a graphical user interface (GUI). As the herein described methods and processes change the data held by the storage machine, and thus transform the state of the storage machine, the state of display subsystem 606 may likewise be transformed to visually represent changes in the underlying data. Display subsystem 606 may include one or more display devices utilizing virtually any type of technology. Such display devices may be combined with logic subsystem 602 and/or storage subsystem 604 in a shared enclosure, or such display devices may be peripheral display devices.

When included, input subsystem 608 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 610 may be configured to communicatively couple computing system 600 with one or more other computing devices. Communication subsystem 610 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 600 to send and/or receive messages to and/or from other devices via a network such as the Internet.

Another example provides a multi-port synchronous dynamic random access memory (SDRAM), comprising a first port and a second port, a first memory portion and a second memory portion, at least the first memory portion being configured as shared, such that the first memory portion is accessible at the first port and not the second port in a first mode, and the first memory portion is accessible at the second port and not the first port in a second mode, and a mode controller controllable to selectively change the multi-port SDRAM between at least the first mode and the second mode. In some such examples, when in the first mode, the second memory portion alternatively or additionally is accessible at the second port. In some such examples, when in the second mode, the first memory portion and the second memory portion additionally or alternatively are accessible at the second port. In some such examples, additionally or alternatively the first port is disabled in the second mode. In some such examples, additionally or alternatively the mode controller comprises a pin configured to receive a mode select signal. In some such examples, additionally or alternatively the mode controller comprises a mode register. In some such examples, alternatively or additionally the SDRAM comprises a third port at which one or more of the first memory portion, the second memory portion, or a third memory portion, are accessible in at least one of the first mode or the second mode.

Another example provides a computing system, comprising a multi-port synchronous dynamic random access memory (SDRAM), comprising a first port and a second port, a first memory portion and a second memory portion, at least the first memory portion being configured as shared, such that when in a first mode, the first memory portion is accessible at the first port and not the second port, and when in a second mode, the first memory portion is accessible at the second port and not the first port, and a mode controller controllable to selectively change the multi-port SDRAM between at least the first mode and the second mode, a first client connected to the first port of the multi-port SDRAM, and a second client connected to the second port of the multi-port SDRAM. In some such examples, alternatively or additionally, when in the first mode, the second memory portion is accessible at the second port. In some such examples, alternatively or additionally, when in the second mode, the first memory portion and the second memory portion are accessible at the second port. In some such examples, the computing system alternatively or additionally comprises a third client connected to a third port of the multi-port SDRAM. In some such examples, alternatively or additionally, the first client comprises a processor and the second client comprises an accelerator. In some such examples, alternatively or additionally, the mode controller comprises one or more of a pin to receive a mode select signal or a mode register. In some such examples, the computing system alternatively or additionally comprises a mobile device.

Another examples provides a method for operating a multi-port synchronous dynamic random access memory (SDRAM) comprising a first port, a second port, a first memory portion, and a second memory portion, the method comprising, operating in a first mode in which the first memory portion is accessible at the first port and not at the second port, receiving, while operating in the first mode, data at the first port and writing the data to the first memory portion, receiving an input changing the multi-port SDRAM to a second mode in which the first memory portion is accessible at the second port and not at the first port, receiving, while operating in the second mode, a read request at the second port, and reading the data from the first memory portion at the second port. In some such examples, the method alternatively or additionally comprises receiving, while operating in the first mode, data at the second port and writing the data at the second port to the second memory portion. In some such examples, the method alternatively or additionally comprises receiving, while operating in the first mode, data at a third port and writing the data at the third port to a third memory portion. In some such examples, the method alternately or additionally comprises disabling the first port while operating in the second mode. In some such examples, receiving the input changing the multi-port SDRAM to the second mode alternatively or additionally comprises receiving a mode select value via a mode controller of the multi-port SDRAM. In some such examples, receiving the data at the first port alternatively or additionally comprises receiving the data from a processor, and wherein reading the data from the first memory portion comprises reading the data from the first memory portion at the second port by an accelerator.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A multi-port synchronous dynamic random access memory (SDRAM), comprising:
   a first port and a second port;
   a first memory portion and a second memory portion, at least the first memory portion being configured as shared, such that
      the first memory portion is accessible at the first port and not the second port in a first mode, and the second memory portion is accessible at the second port in the first mode, and
      the first memory portion is accessible at the second port and not the first port in a second mode; and
   a mode controller controllable to selectively change the multi-port SDRAM between at least the first mode and the second mode.

2. The SDRAM of claim 1, wherein, when in the second mode, the first memory portion and the second memory portion are accessible at the second port.

3. The SDRAM of claim 2, wherein the first port is disabled in the second mode.

4. The SDRAM of claim 1, wherein the mode controller comprises a pin configured to receive a mode select signal.

5. The SDRAM of claim 1, wherein the mode controller comprises a mode register.

6. The SDRAM of claim 1, further comprising a third port at which one or more of the first memory portion, the second memory portion, or a third memory portion, are accessible in at least one of the first mode or the second mode.

7. A computing system, comprising:
   a multi-port synchronous dynamic random access memory (SDRAM), comprising
      a first port and a second port,
      a first memory portion and a second memory portion, at least the first memory portion being configured as shared, such that when in a first mode, the first memory portion is accessible at the first port and not the second port, and when in a second mode, the first memory portion is accessible at the second port and not the first port, and
      a mode controller controllable to selectively change the multi-port SDRAM between at least the first mode and the second mode;
   a first client connected to the first port of the multi-port SDRAM; and
   a second client connected to the second port of the multi-port SDRAM.

8. The computing system of claim 7, wherein, when in the first mode, the second memory portion is accessible at the second port.

9. The computing system of claim 7, wherein, when in the second mode, the first memory portion and the second memory portion are accessible at the second port.

10. The computing system of claim 7, further comprising a third client connected to a third port of the multi-port SDRAM.

11. The computing system of claim 7, wherein the first client comprises a processor and the second client comprises an accelerator.

12. The computing system of claim 7, wherein the mode controller comprises one or more of a pin to receive a mode select signal or a mode register.

13. The computing system of claim 7, wherein the computing system comprises a mobile device.

14. A method for operating a multi-port synchronous dynamic random access memory (SDRAM) comprising a first port, a second port, a first memory portion, and a second memory portion, the method comprising:
   operating in a first mode in which the first memory portion is accessible at the first port and not at the second port;
   receiving, while operating in the first mode, data at the first port and writing the data to the first memory portion;
   receiving, while operating in the first mode, data at the second port and writing the data at the second port to the second memory portion;
   receiving an input changing the multi-port SDRAM to a second mode in which the first memory portion is accessible at the second port and not at the first port; and
   receiving, while operating in the second mode, a read request at the second port, and reading the data from the first memory portion at the second port.

15. The method of claim 14, further comprising receiving, while operating in the first mode, data at a third port and writing the data at the third port to a third memory portion.

16. The method of claim 14, further comprising, disabling the first port while operating in the second mode.

17. The method of claim 14, wherein receiving the input changing the multi-port SDRAM to the second mode comprises receiving a mode select value via a mode controller of the multi-port SDRAM.

18. The method of claim 14, wherein receiving the data at the first port comprises receiving the data from a processor, and wherein reading the data from the first memory portion comprises reading the data from the first memory portion at the second port by an accelerator.

* * * * *